United States Patent
Hayashi

(10) Patent No.: US 7,859,063 B2
(45) Date of Patent: Dec. 28, 2010

(54) SEMICONDUCTOR DEVICE USING SOI-SUBSTRATE

(75) Inventor: Hirokazu Hayashi, Tokyo (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 184 days.

(21) Appl. No.: 12/336,257

(22) Filed: Dec. 16, 2008

(65) Prior Publication Data

US 2009/0152630 A1 Jun. 18, 2009

(30) Foreign Application Priority Data

Dec. 17, 2007 (JP) .............................. 2007-324136

(51) Int. Cl.
*H01L 21/00* (2006.01)
*H01L 21/84* (2006.01)

(52) U.S. Cl. .................. 257/382; 257/383; 438/179; 438/479; 438/517; 438/300

(58) Field of Classification Search ................ 257/382, 257/383; 438/149, 479, 517, 300
See application file for complete search history.

(56) References Cited

U.S. PATENT DOCUMENTS

| 2003/0211713 | A1* | 11/2003 | Suguro et al. | 438/481 |
| 2006/0049467 | A1* | 3/2006 | Lim et al. | 257/383 |
| 2006/0125041 | A1* | 6/2006 | Yang et al. | 257/476 |
| 2007/0184611 | A1* | 8/2007 | Oh et al. | 438/244 |

FOREIGN PATENT DOCUMENTS

JP 2005-150402 6/2005
JP 2006-165505 6/2006

* cited by examiner

*Primary Examiner*—Zandra Smith
*Assistant Examiner*—Telly D Green
(74) *Attorney, Agent, or Firm*—Rabin & Berdo, PC

(57) ABSTRACT

According to a feature of the present invention, a semiconductor device includes a SOI substrate, including a semiconductor substrate; an insulating layer formed on the semiconductor substrate and a silicon layer formed on the insulating layer. A drain region and a source region are formed in the silicon layer so that the source region is in contact with the insulating layer but the drain region is not in contact with the insulating layer.

2 Claims, 6 Drawing Sheets

FIG. 1

|  | BULK CMOS | SOI CMOS | |
|---|---|---|---|
|  |  | PD SOI | FD SOI |
| JUNCTION CAPACITANCE (RELATIVE TO BULK CMOS) | 1 | 0.1 or Higher | 0.1 |
| SUBTHRESHOLD PROPERTY (S VALUE) | 80–90mV/dec | 80–90mV/dec | 60–70mV/dec |
| SOURCE-DRAIN VOLTAGE RESISTANT | HIGH | HIGH | LOW |
| LATCHUP | YES | NO | NO |
| SUBSTRATE FLOATING EFFECT | NO | YES | NO |
| WORKABILITY | REFERENCE | BULK LEVEL | LOW |

SEMICONDUCTOR DEVICE USING SOI-SUBSTRATE

CROSS REFERENCE TO RELATED APPLICATION

This application claims the priority of Application No. 2007-324136, filed Dec. 17, 2007 in Japan, the subject matter of which is incorporated herein by reference.

TECHNICAL FIELD OF THE INVENTION

The present invention relates to a semiconductor device using a SOI substrate and a method for fabricating the same. In particular, the present invention relates to a high voltage device, having improved characteristics of source/drain voltage resistant, and a method for fabricating the same.

BACKGROUND OF THE INVENTION

In general, performance and efficiency of a LSI depends on performance and efficiency, including power consumption, of transistors. When the threshold voltage "Vt" of transistors increases, leak current would be reduced and power consumption would improve. However, performance, including the operation speed, would be decreased, under a condition of constant voltage supply. On the other hand, when the threshold voltage "Vt" of transistors decreases, performance, including the operation speed, would be increased, however, leak current would be increased. For that reason, it is required to determine a threshold voltage "Vt" of transistors in consideration of the application of the LSI. However, since performance of a transistor depends on physical characteristics, including device structure and impurity profile, it is difficult to improve performance of a conventional bulk-CMOS.

A SOI (Silicon On Insulator) structure is based on a relatively new process technology, and has been proposed to improve performance of a transistor. In a conventional bulk-CMOS, transistors are formed on a silicon substrate. On the other hand, according to a CMOS using a SOI substrate, transistors are formed on a silicon layer, formed on an insulating layer (SiO2). According to such a CMOS using a SOI substrate, adjacent elements are completely isolated from each other, so that electrical interference including leak current and noises could be prevented. In other words, according to such a CMOS, parasitic capacitance is reduced, leak current is reduced, and electrical interferences among transistors is reduced.

When fabricating a CMOS, using a SOI substrate, a silicon layer is formed on an insulating layer and a gate is formed on the silicon layer. A PD (Partially Depleted) SOI and a FD (Fully Depleted) SOI can be distinguishably formed by adjusting a thickness of the silicon layer. Since the thicknesses of silicon layers (SOI layers) are different from each other between PD-SOI and FD-SOI, operation characteristics are different from each other. In qualification, a FD-SOI has better performance as a transistor. However, a special fabrication process is required to form a FD-SOI. On the other hand, a PD-SOI has characteristics which are similar to a bulk type.

FIG. 1 shows characteristics of a bulk-CMOS, FDSOI-CMOS and a PDSOI-COMS. In general, a FDSOI-CMOS has a better switching property as compared to the other CMOSs, however, a source/drain voltage resistant is lower. Further, according to a FDSOI-CMOS, since a drain junction area is small, a depleted region is not extended around the drain region entirely. For that reason, electric field is focused at a specific small area, so that a calorific value, which is represented by "E (electric filed)*J (current density)", is increased. As a result, devices are easily damaged or broken with heat. Here, junction capacitance is proportional to a junction area.

Since the thickness of silicon layer (SOI layer) of a PD-SOI is large, a minority carrier (electron holes for a N-channel MOSFET) generated at the substrate side in the SOI layer is accumulated, and therefore, a substrate floating effect is easily occurred. On the other hand, since the thickness of silicon layer of a FD-SOI is small, generated carrier is transferred to a source electrode, so that a substrate floating effect is hardly occurred. In addition, according to a FD-SOI, a source/drain voltage resistant is low, so that a power supply voltage may not be determined high; and is not appropriate for a protection device because of a device damage or brokenness.

Patent Publication 1 discloses a semiconductor device in which one of source and drain regions and a part of a channel region are formed above a buried oxide layer, while the other of source and drain regions and the remaining of the channel region are formed above a Si epitaxial layer, so that a junction leak current and a capacitance are reduced.

Patent Publication 2 discloses a FD-SOI MOSFET in which a short channel effect is remarkably prevented and a Kink effect is prevented (repressed), even though such a MOSFET has a SOI layer and a BOX layer having thicknesses which are the same as those for a conventional FD-SOI MOSFET. A short channel effect is generated when drain electric filed passes through a BOX layer. A p+ region is formed to extend from a boundary between at least one of n+ source region and n+ drain region and a buried oxide layer to an opposite side of a p− body region of the at least one of n+ source region and n+ drain region. The p+ region is shaped to be "L".

As described above, Patent Publications 1 and 2 are in the same technical field as the present invention, however, the fundamental structure and operations are different from the present invention and those priori art can not be a motivation to generate the present invention.

Patent Publication 1: JP 2006-165505A
Patent Publication 2: JP 2005-150402A

OBJECTS OF THE INVENTION

Accordingly, an object of the present invention is to provide an improved semiconductor device and an improved method for fabricating the same, in which a source/drain voltage resistant is increased while keeping fundamental characteristics of FS-SOI.

Another object of the present invention is to provide an improved semiconductor device and an improved method for fabricating the same, in which an allowable electric power is increased.

Additional objects, advantages and novel features of the present invention will be set forth in part in the description that follows, and in part will become apparent to those skilled in the art upon examination of the following or may be learned by practice of the invention. The objects and advantages of the invention may be realized and attained by means of the instrumentalities and combinations particularly pointed out in the appended claims.

SUMMARY OF THE INVENTION

According to a first feature of the present invention, a semiconductor device includes a SOI substrate, including a semiconductor substrate; an insulating layer formed on the semiconductor substrate and a silicon layer formed on the insulating layer. A drain region and a source region are formed in the silicon layer so that the source region is in contact with the insulating layer but the drain region is not in contact with the insulating layer.

According to a second aspect of the present invention, a method for fabricating a semiconductor device, comprising the steps of: preparing a semiconductor substrate; forming an insulating layer on the semiconductor substrate; forming a silicon layer on the insulating layer; and forming a source region and a drain region in the silicon layer. The source region is in contact with the insulating layer but the drain region is not in contact with the insulating layer.

Preferably, a part of the silicon layer, located at a region corresponding to a device-isolation region, is selectively removed from the insulating layer, after that the insulating layer is shaped by a wet-oxidation process using the remained silicon layer as a mask.

According to the present invention, a depletion layer extends both toward a channel region and a lower part of a drain region, so that a junction area between the drain region and a SOI layer is increased. As a result, a source/drain voltage resistant is increased while keeping fundamental characteristics of FS-SOI. In addition, an allowable electric power is increased.

BRIEF DESCRIPTION OF THE DRAWINGS

FIG. 1 is a table showing characteristics of a bulk-CMOS, FDSOI-CMOS and a PDSOI-COMS.

DESCRIPTION OF REFERENCE NUMERALS

102: Semiconductor Substrate
104: Insulating Layer (BOX layer)
105: SOI layer (Silicon Layer)
108: Source Region
110: Drain Region

DETAILED DISCLOSURE OF THE INVENTION

In the following detailed description of the preferred embodiments, reference is made to the accompanying drawings which form a part hereof, and in which is shown by way of illustration specific preferred embodiments in which the inventions may be practiced. These preferred embodiments are described in sufficient detail to enable those skilled in the art to practice the invention, and it is to be understood that other preferred embodiments may be utilized and that logical, mechanical and electrical changes may be made without departing from the spirit and scope of the present inventions. The following detailed description is, therefore, not to be taken in a limiting sense, and scope of the present inventions is defined only by the appended claims.

Figure 2:
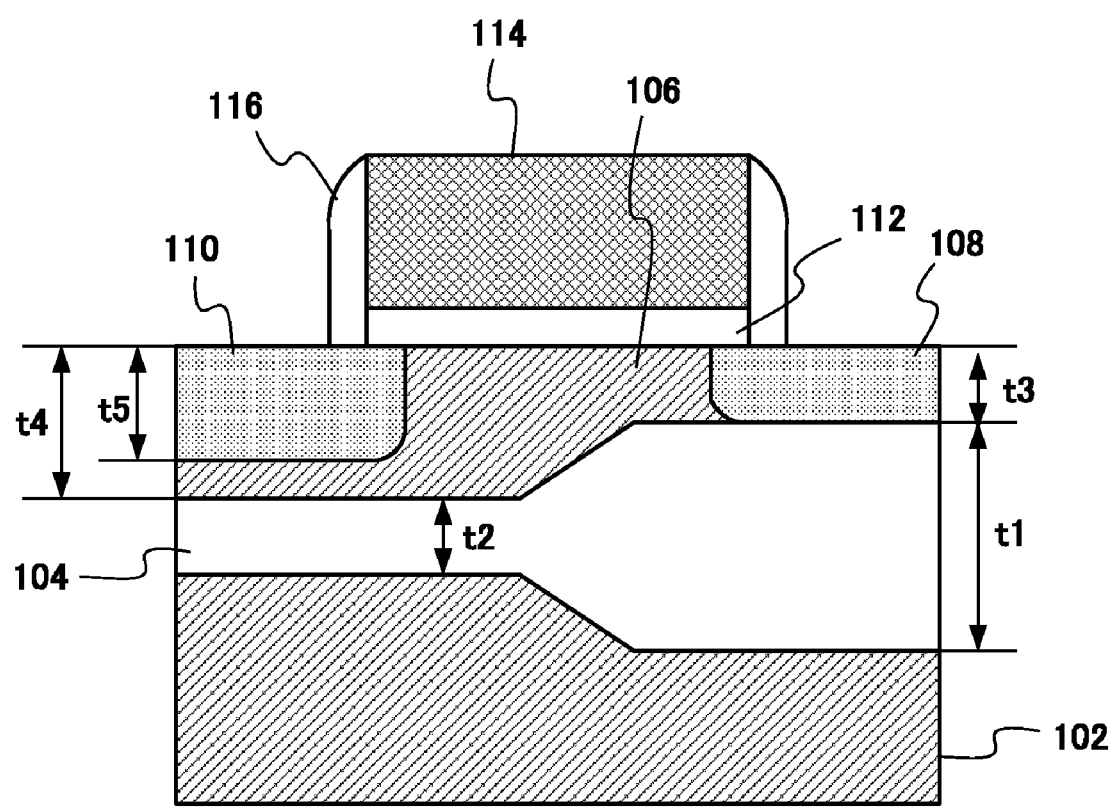
FIG. 2 is a cross sectional view illustrating a structure of a semiconductor device according to an embodiment of the present invention.

FIG. 2 is a cross sectional view illustrating a structure of a semiconductor device according to an embodiment of the present invention. A semiconductor device, according to the present embodiment, is fabricated using a SOI substrate including a semiconductor substrate (Si) 102, an insulating layer (BOX layer) 104 formed on the semiconductor substrate 102, and a SOI layer (Si) 106. A drain region 110 and a source region 108 are formed in or on the SOI layer 106. The source region 108 is in contact with the insulating layer 104, but the drain region 110 is not in contact with the insulating layer 104.

A gate insulating layer (SiO2) 112 is formed on the SOI layer, and a gate electrode (Poly-Si) 114 is formed on the gate insulating layer 112. A sidewall 116 is formed on side surface of the gate electrode 114.

The insulating layer 104 includes a stepped region (thick-film region) projected toward the source region 108. The insulating layer 104 has a smaller thickness "t2" at a region below the drain region 110 and a larger thickness "t1" at a region below the source region 108.

In FIG. 2, the thickness of each region is determined as follows:

Thickness "t1" of the insulating layer 104 at a region below the source region 108: 0.15 um (1500 angstroms)

Thickness "t2" of the insulating layer 104 at a region below the drain region 110: 0.05 um (500 angstroms)

Thickness "t3" of the source region 108: 0.05 um (500 angstroms)

Thickness "t4" of the SOI layer 106: 0.15 um (1,500 angstroms)

Thickness "t5" of the drain region 110: 0.10 um (1,000 angstroms)

According to the present invention, a depletion layer extends both toward a channel region and a lower part of the drain region, so that a junction area between the drain region 110 and the SOI layer 106 is increased. As a result, a source/drain voltage resistant is increased and an allowable electric power is increased.

Minority carries generated at an end of the drain region 110, which is in contact with the SOI layer, flow toward the source region 108 having a lower potential level. As a result, such minority carries are not retained in the substrate, and a substrate floating effect is hardly occurred.

Further, the insulating layer (BOX layer) 104 has a smaller thickness at a region below the drain region 110, so that heat, generated at an end of the drain region 110, which is in contact with the SOI layer, is transferred easily to the semiconductor substrate 102. As a result, characteristic deterioration due to self-heating effect is reduced. In general, according to a transistor fabricated using a bulk (Si) substrate, heat generated at an end of the drain is spread to the substrate. On the other hand, according to a transistor fabricated using a SOI substrate, since an active region is surrounded by an SOI layer, heat is not transferred outwardly but retained in the SOI layer, which is called "self-heating effect".

Figure 3A:
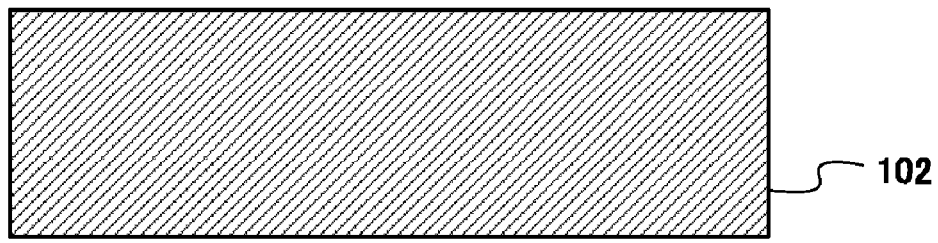
FIGS. 3A-3J are cross sectional views showing fabrication steps of a semiconductor device according to an embodiment of the present invention.
Figure 3B:
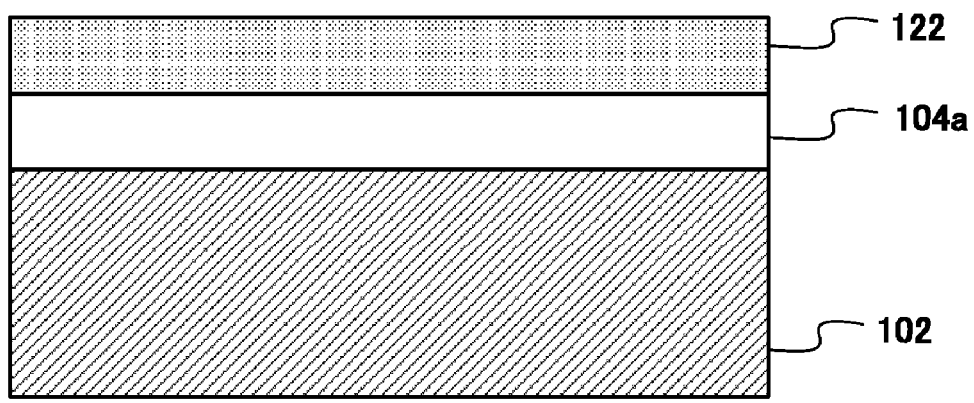

FIGS. 3A-3J are cross sectional views showing fabrication steps of a semiconductor device according to an embodiment of the present invention. First, as shown in FIG. 3A, a semiconductor (Si) substrate 102 is prepared. Next, as shown in FIG. 3B, a silicon oxide layer (SiO2) 104a is formed to have a thickness of 250 angstroms on the semiconductor substrate 102 by a CVD process. After that, a Si3N4 layer 122 is formed to have a thickness of 2000 angstroms on the silicon oxide layer 104a.

Figure 3C:
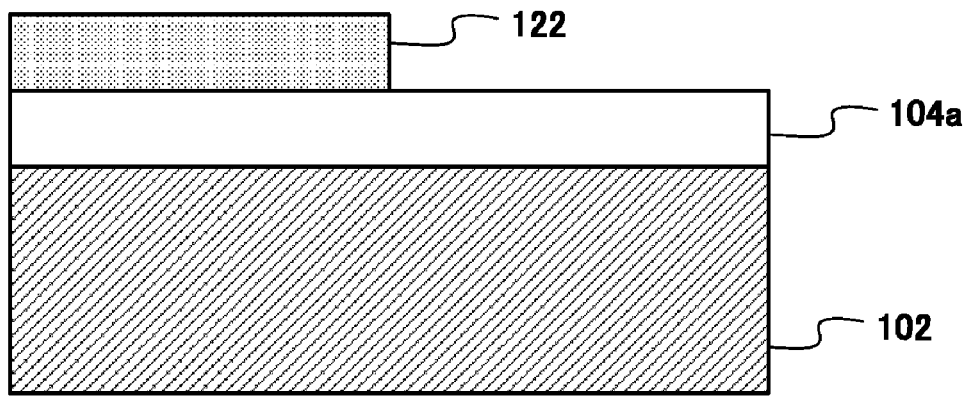
Figure 3D:
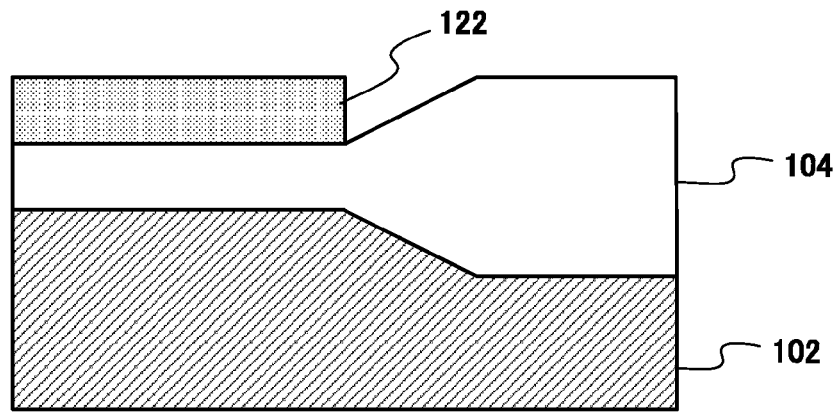

Subsequently, as shown in FIG. 3C, the Si3N4 layer 122 is selectively removed by an etching process at a region corresponding to a device-isolation region (LOCOS region) on the source side. Next, a LOCOS (SiO2) region 104 is shaped, as shown in FIG. 3D, by a wet-oxidation process at 1000 degrees C. for 90 minutes using the remained part of the Si3N4 layer 122 as a mask.

Figure 3E:
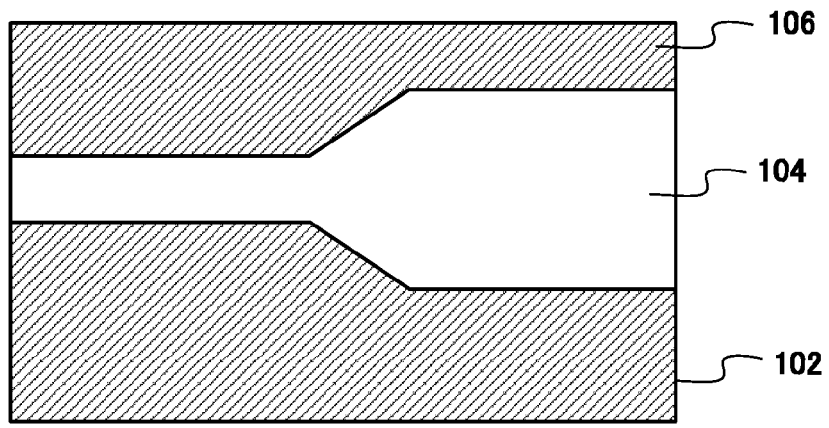

Next, a silicon epitaxial layer (SOI layer) 106 is formed on the insulating layer 104, and as shown in FIG. 3E, the SOI layer 106 is flattened.

Figure 3F:
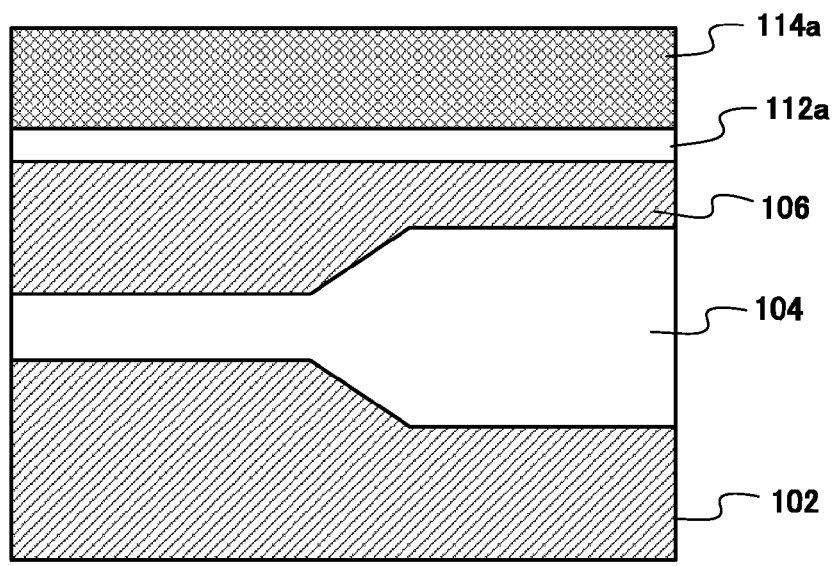
Figure 3G:
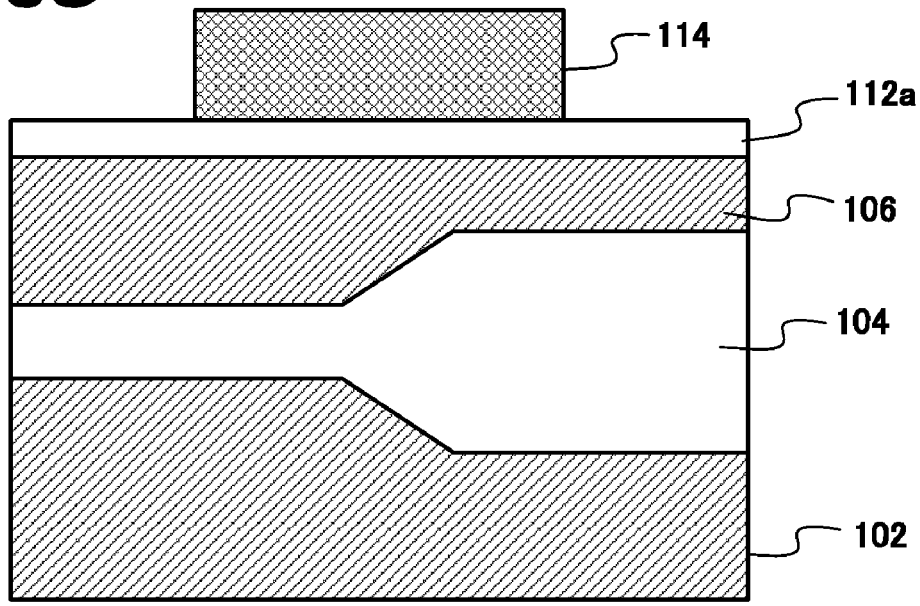

Next, as shown in FIG. 3F, a silicon oxide layer 112a, which is to be a gate oxide layer 112, is formed on the silicon epitaxial (SOI) layer 106. Subsequently, a poly-silicon layer 114a, which is to be a gate electrode 114, on the silicon oxide layer 112a. After that, as shown in FIG. 3G, the poly-silicon layer 114 is patterned to shape a gate electrode 114.

Figure 3H:
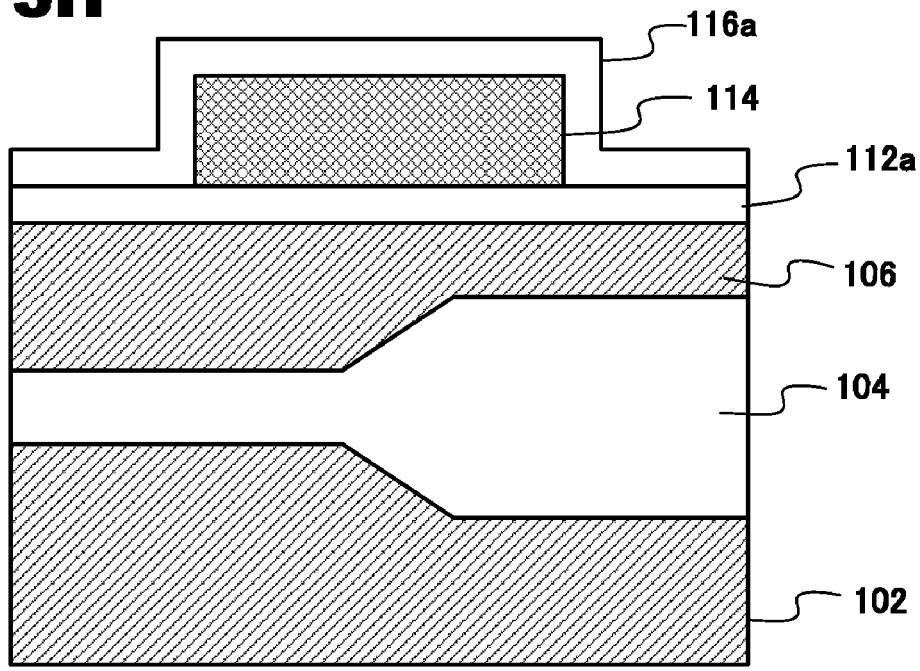
Figure 3I:
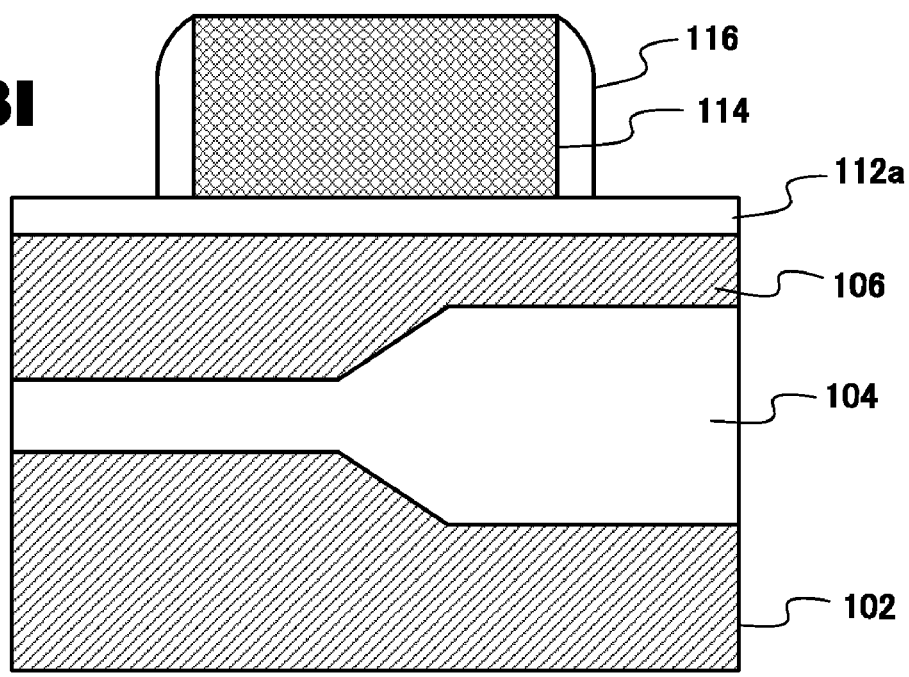

Next, as shown in FIG. 3H, a layer 116a for a side wall 116 is formed over the gate electrode 114 and the silicon oxide layer 112a. After that, the layer 116a is etched to form a side wall 116 on the side surface of the gate electrode 114, as shown in FIG. 3I.

Figure 3J:
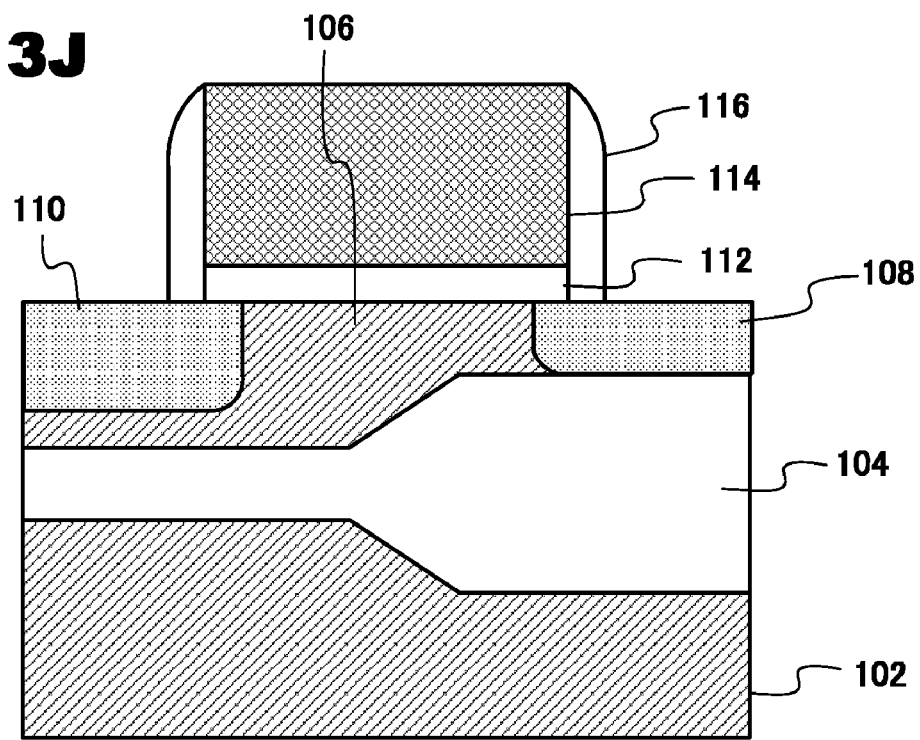

Next, arsenic (N+) is ion-implanted into a surface of the SOI layer 106 under condition of acceleration energy 50 KeV, dose amount 5E15 cm-2, and the substrate is heated to form source and drain regions 108 and 110, as shown in FIG. 3J. Polarity of impurity to be ion-implanted should be changed depending on the channel (N or P) of the transistor to be fabricated.

SIMOX (Separation by Implanted Oxygen) method can be applied to form a stepped portion of the insulating (BOX) layer 104

What is claimed is:

1. A semiconductor device, comprising:
   a SOI substrate, including a semiconductor substrate; an insulating layer formed on the semiconductor substrate and a silicon layer formed on the insulating layer, wherein
   a drain region and a source region are formed in the silicon layer so that the source region is in contact with the insulating layer but the drain region is not in contact with the insulating layer.

2. A semiconductor device according to claim 1, wherein the insulating layer comprises a stepped region projected toward the source region.

* * * * *